United States Patent
Nam et al.

(10) Patent No.: US 7,759,185 B2
(45) Date of Patent: Jul. 20, 2010

(54) SEMICONDUCTOR DEVICE AND METHOD OF FABRICATING THE SAME

(75) Inventors: Seo-woo Nam, Yongin-si (KR); Young-joon Moon, Seoul (KR); Hong-jae Shin, Seoul (KR); Nae-in Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 227 days.

(21) Appl. No.: 11/853,187

(22) Filed: Sep. 11, 2007

(65) Prior Publication Data
US 2008/0272436 A1 Nov. 6, 2008

(30) Foreign Application Priority Data
Sep. 28, 2006 (KR) .................. 10-2006-0095116

(51) Int. Cl.
*H01L 21/8238* (2006.01)
(52) U.S. Cl. .................. 438/199; 257/E21.214; 438/197
(58) Field of Classification Search .......... 438/197, 438/199, 287, 692, 216, 200, 218, 702, 637; 257/369, E21.159, E21.616, E21.214, E21.24, 257/E21.249, E21.632
See application file for complete search history.

(56) References Cited

U.S. PATENT DOCUMENTS 5,153,145 A 10/1992 Lee et al.

(Continued)

FOREIGN PATENT DOCUMENTS

JP 05-102326 4/1993

(Continued)

OTHER PUBLICATIONS

English Abstract for Publication No. 05-102326, Sep. 13, 1991.

(Continued)

*Primary Examiner*—Davienne Monbleau
*Assistant Examiner*—Shweta Mulcare
(74) *Attorney, Agent, or Firm*—F. Chau & Associates, LLC

(57) ABSTRACT

A semiconductor device includes a first stress film covering a first gate electrode and first source/drain areas of a first transistor area and at least a portion of a third gate electrode of an interface area, a second stress film covering a second gate electrode and second source/drain areas of a second transistor area and overlapping at least a portion of the first stress film on the third gate electrode of the interface area, and an interlayer insulating film formed on the first and the second stress film. The semiconductor device further includes a plurality of first contact holes formed through the interlayer insulating film and the first stress film in the first transistor area to expose the first gate electrode and the first source/drain areas, a plurality of second contact holes formed through the interlayer insulating film and the second stress film in the second transistor area to expose the second gate electrode and the second source/drain areas, and a third contact hole formed through the interlayer insulating film, the second stress film, and the first stress film in the interface area to expose the third gate electrode. A depth of a recessed portion of an upper side of the third gate electrode in which the third contact hole is formed is equal to or larger than a depth of a recessed portion of an upper side of the first gate electrode in which the first contact hole is formed.

15 Claims, 13 Drawing Sheets

U.S. PATENT DOCUMENTS

| | | |
|---|---|---|
| 6,372,634 B1 * 4/2002 | Qiao et al. | 438/637 |
| 7,442,611 B2 * 10/2008 | Chan et al. | 438/275 |
| 2006/0046400 A1 * 3/2006 | Burbach et al. | 438/282 |
| 2006/0091471 A1 * 5/2006 | Frohberg et al. | 257/369 |
| 2007/0108525 A1 * 5/2007 | Yang et al. | 257/351 |
| 2008/0050869 A1 * 2/2008 | Sudo | 438/228 |
| 2009/0017630 A1 * 1/2009 | Lee et al. | 438/702 |

FOREIGN PATENT DOCUMENTS

| | | |
|---|---|---|
| JP | 2003-060076 | 2/2003 |
| JP | 2003-273240 | 9/2003 |
| KR | 1020050076256 | 7/2005 |

OTHER PUBLICATIONS

English Abstract for Publication No. 2003-060076, Aug. 21, 2001.
English Abstract for Publication No. 2003-273240, Mar. 19, 2002.
English Abstract for Publication No. 1020050076256, Jan. 20, 2004.
Notice of Allowance for corresponding Korean Application No. 9-5-2007-052563105, Sep. 28, 2007.

* cited by examiner

SEMICONDUCTOR DEVICE AND METHOD OF FABRICATING THE SAME

This application claims priority from Korean Patent Application No. 10-2006-0095116 filed on Sep. 28, 2006, the disclosure of which is hereby incorporated by reference herein in its entirety.

BACKGROUND OF THE INVENTION

1. Technical Field

The present disclosure relates to a semiconductor device and to a method of fabricating the same and, more particularly, to a semiconductor device including a dual stress film and to a method of fabricating the same.

2. Description of the Related Art

Due to high integration and high speed of metal oxide semiconductor field effect transistors (MOSFET), various processes have been research to form transistors that do not generate errors and which have improved performance. Particularly, many processes are being developed to increase the mobility of electrons or holes to fabricate high-performance transistors.

A process of applying physical stress to a channel area to change an energy band structure of the channel area may be performed to increase the mobility of the electrons or the holes. For example, n-channel metal oxide semiconductors (NMOS) transistors have improved performance when tensile stress is applied to a channel, and p-channel metal oxide semiconductors (PMOS) transistors have improved performance when compressive stress is applied to a channel. Accordingly, a dual stress film structure where a tensile stress film is formed on the NMOS transistor and a compressive stress film is formed on the PMOS transistor to improve the performance of both the NMOS transistor and the PMOS transistor is being researched.

However, when a dual stress film is applied, an area where the tensile stress film and the compressive stress film partially overlap may be formed at the interface of the NMOS transistor and the PMOS transistor according to characteristics of devices or photolithography margins. The overlapping area of the stress film may be thicker than the area where the single stress film is layered. Therefore, when contact holes are formed through the single stress film and the overlapping area using an etching process, the contact holes may first be formed through the single stress film, and a lower structure of the contact holes which are formed beforehand may be attacked before the contact holes are formed through the overlapping area. Accordingly, the contact characteristics and the reliability of the semiconductor device may be reduced.

SUMMARY OF THE INVENTION

Preferred embodiments of the present invention provide a semiconductor device that includes a dual stress film and which has improved contact characteristic.

Preferred embodiments of the present invention provide a method of fabricating a semiconductor device that includes a dual stress film and which has improved contact characteristics.

In accordance with a preferred embodiment of the present invention, a semi conductor device is provided. The semiconductor device includes a semiconductor substrate that includes a first transistor area having a first gate electrode and first source/drain areas, a second transistor area having a second gate electrode and second source/drain areas, and an interface area provided at an interface of the first transistor area and the second transistor area and having a third gate electrode. The semiconductor device further includes a first stress film covering the first gate electrode and the first source/drain areas of the first transistor area and at least a portion of the third gate electrode of the interface area, a second stress film covering the second gate electrode and the second source/drain areas of the second transistor area and overlapping at least a portion of the first stress film on the third gate electrode of the interface area, an interlayer insulating film formed on the first and the second stress film, a plurality of first contact holes formed through the interlayer insulating film and the first stress film in the first transistor area to expose the first gate electrode and the first source/drain areas, a plurality of second contact holes formed through the interlayer insulating film and the second stress film in the second transistor area to expose the second gate electrode and the second source/drain areas, and a third contact hole formed through the interlayer insulating film, the second stress film, and the first stress film in the interface area to expose the third gate electrode. A depth of a recessed portion of an upper side of the third gate electrode in which the third contact hole is formed is equal to or larger than a depth of a recessed portion of an upper side of the first gate electrode in which the first contact hole is formed.

In accordance with a preferred embodiment of the present invention, a method of fabricating a semiconductor device is provided. The method includes forming a first stress film covering a first gate electrode and first source/drain areas of a first transistor area of a semiconductor substrate and at least a portion of a third gate electrode of an interface area between the first transistor area and a second transistor area, forming a second stress film covering a second gate electrode and second source/drain areas of the second transistor area of the semiconductor substrate and overlapping at least a portion of the first stress film on the third gate electrode of the interface area, forming an interlayer insulating film on the semiconductor substrate, and patterning the interlayer insulating film to form a plurality of preliminary contact holes through which the first stress film on the first gate electrode and the first source/drain areas and the second stress film on the second and the third gate electrodes and the second source/drain areas are exposed. The method further includes filling the plurality of preliminary contact holes using a tilling material, removing the filling material to expose the second stress film in the interface area while the filling material remains in the preliminary contact holes of the first transistor area and the second transistor area, removing the exposed second stress film of the interlace area, removing the remaining filling material to expose the first stress film of the first transistor area and the second stress film of the second transistor area, and removing the exposed first stress film and second stress film to form a plurality of contact holes through which the first, the second, and the third gate electrodes, and the first and the second source/drain areas are exposed.

BRIEF DESCRIPTION OF THE DRAWINGS

Preferred embodiments of the present invention can be understood in more detail from the following description taken in conjunction with the attached drawings in which.

DESCRIPTION OF THE PREFERRED EMBODIMENTS OF THE INVENTION

Figure 1:
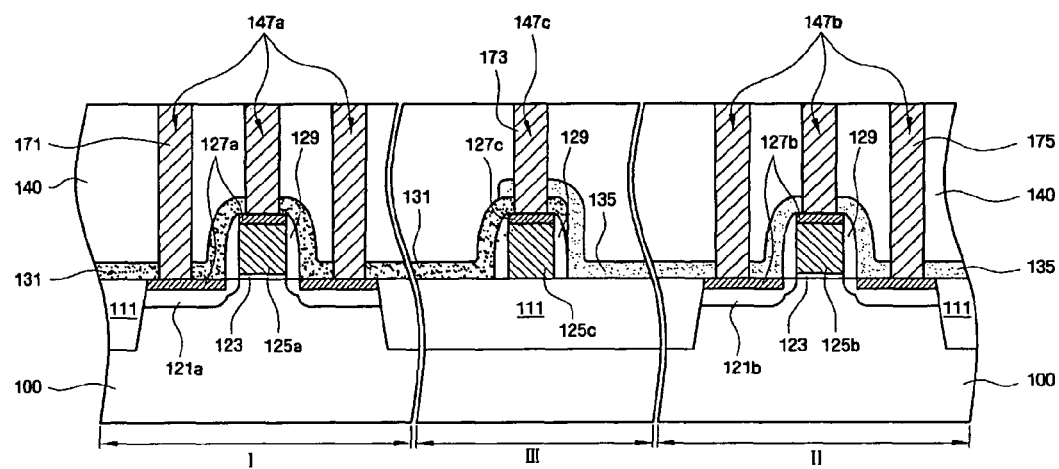
FIG. 1 is a sectional view of a semiconductor device according to an embodiment of the present invention.

The present invention may, however, be embodied in many different forms and should not be construed as being limited to the embodiments set forth herein.

Therefore, in the embodiments of the present invention, detailed description of known processes, structures, and techniques incorporated herein will be omitted when it may make the subject matter of the present invention unclear.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated elements, steps, operations, and/or components, but do not preclude the presence or addition of one or more other elements, steps, operations, and/or components. Additionally, the term "and/or" includes any and all combinations of one or more of the associated listed items. Furthermore, like numbers refer to like elements throughout.

The present invention will be described with reference to cross-sectional views and/or schematic views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in the manufacturing processes. For the convenience of description, constituent elements in the drawings of the present invention can be slightly enlarged or reduced.

Hereinafter, a description will be given of semiconductor devices according to embodiments of the present invention with reference to the accompanying drawings.

FIG. 1 is a sectional view of a semiconductor device according to a first embodiment of the present invention. With reference to FIG. 1, a semiconductor device includes a plurality of transistors that is formed on the semiconductor substrate. The semiconductor substrate 100 may be divided into at least three areas, for example, an NMOS transistor area (I), a PMOS transistor area (II), and an interface area (III).

The semiconductor substrate 100 may be made of, for example, silicon (Si), germanium (Ge), silicon germanium (SiGe), gallium phosphide (GaP), gallium arsenide (GaAs), silicon carbide (SiC), silicon germanium carbide (SiGeC), indium arsenide (InAs), indium phosphide (InP), or a mixture thereof. Moreover, the semiconductor substrate 100 may be a laminated substrate where at least two layers including a semiconductor substance layer formed of the above-mentioned substances and an insulating layer are layered. Examples of the semiconductor substrate may include an SOI (Silicon On Insulator) substrate. An isolation film 111 that defines an active area is formed in the semiconductor substrate 100. Furthermore, a P-type well may be formed in the semiconductor substrate 100 of the NMOS transistor area (I) and an N-type well may be formed in the semiconductor substrate 100 of the PMOS transistor area (II).

The NMOS transistor which is formed in the NMOS transistor area (I) and the PMOS transistor which is formed in the PMOS transistor area (II) include gate electrodes 125a and 125b formed on the semiconductor substrate 100 so that gate insulating films 123 are interposed between the gate electrodes and the semiconductor substrate, source/drain areas 121a and 121b formed in the semiconductor substrate 100 so that the source/drain areas face each other while the gate electrodes 125a and 125b are provided between the source/drain areas, and channel areas which are provided between the source/drain areas 121a and 121b facing each other and overlap lower portions of the gate electrodes 125a and 125b.

The gate electrodes 125a and 125b may be a single film formed of, for example, a polysilicon film, a metal film, or a metal silicide film, or a laminated film thereof. In the polysilicon film, for example, the N-type impurity is doped into the NMOS transistor area (I) and the P-type impurity is doped into the PMOS transistor area (II). However, the polysilicon film is not limited to the above-mentioned structure. The conductive types of impurity doped into the areas of the polysilicon film may be reversed as compared to the above-mentioned structure, or the areas may have the same conductive type. Examples of metal components constituting the metal film or the silicide film may include tungsten (W), cobalt (Co), nickel (Ni), titanium (Ti), and tantalum (Ta). However, hereinafter, only a description of the gate electrodes 125a and 125b that include the polysilicon film and the silicide films 127a and 127b formed on the polysilicon film will be given.

The gate insulating films 123 are interposed between the semiconductor substrate 100 and the gate electrodes 125a and 125b. The gate insulating films 123 may be formed of for example, a silicon oxide film. However, a film constituting the gate insulating film is not limited to the silicon oxide film, but another high dielectric insulating film or low dielectric insulating film may be used if necessary.

Spacers 129 are formed on walls of the gate electrodes 125a and 125b and the gate insulating films 123. The spacers are formed of, for example, a silicon nitride film.

The source/drain areas 121a and 121b include an LDD (light doped drain) area that overlaps the spacers 129 and a high-concentration doping area that does not overlap the spacers 129. In the NMOS transistor area (I), the N-type impurity is doped into the LDD area at a low concentration, and the N-type impurity is doped into the high-concentration doping area at a high concentration. In the PMOS transistor area (II), the P-type impurity is doped into the LDD area at a low concentration, and the P-type impurity is doped into the high-concentration doping area at a high concentration. In a modified embodiment of the present invention, a DDD (double diffused drain) area may be provided instead of the LDD area.

The source/drain areas 121a and 121b may include the silicide films 127a and 127b that are identical or similar to the silicide films formed on upper parts of the gate electrodes 125a and 125b on upper parts thereof. In the specification, the silicide films 127a and 127b are divided for the convenience of description. That is, the silicide films 127a and 127b included in the source/drain areas 121a and 121b and the silicide films 127a and 127b included in the gate electrodes 125a and 125b are designated by the same reference numeral if they are provided in the same area. However, substances constituting the films may be different from each other.

Meanwhile, a gate electrode 125c and a spacer 129 that have substantially the same structure as those of the NMOS transistor area (I) and the PMOS transistor area (II) are formed in the interface area (III). Accordingly, an upper part of the gate electrode 125c of the interface area (III) may include a silicide film 127c. The gate electrode 125c of the interface area (III) may be formed on the isolation film 111. In this case, as shown in FIG. 1, the gate insulating film 123 may be omitted. Meanwhile, in the present embodiment, the gate electrode 125c of the interface area (III) may be formed on the active area. In this case, the gate electrode 125c may constitute a portion of the NMOS transistor or the PMOS transistor.

A first stress film 131 and/or a second stress film 135 are formed on the above-mentioned gate electrodes 125a, 125b, and 125c of the NMOS transistor area (I), the PMOS transistor area (II), and the interface area (III).

For example, the first stress film 131 having tensile stress is formed in the NMOS transistor area (I), and the second stress film 135 having compressive stress is formed in the PMOS transistor area (II). The first stress film 131 and the second stress film 135 may be formed of, for example, silicon nitride (SiN), silicon oxynitride (SiON), silicon boron nitride (SiBN), silicon carbide (SIC), hydrogenated silicon carbide (SiC:H), hydrogenated silicon oxycarbide (SiCOH), silicon carbon nitride (SiCN), silicon dioxide ($SiO_2$), or a combination thereof and each have a thickness in the range of about 1 to about 1,000 angstroms (Å). Preferably, the first stress film 131 and the second stress film 135 may be substantially the same as each other in terms of thickness.

The stress of the first stress film 131 and the second stress film 135 may be controlled depending on a composition ratio of substances constituting the films or a formation condition of the substances. For example, the first stress film 131 may have tensile stress of about 0.01 to about 5 GPa, and the second stress film 135 may have compressive stress of about −0.01 to about −5 GPa.

The first stress film 131 and the second stress film 135 apply stress to the channel area so as to increase mobility of carriers. That is, the first stress film 131 covers the gate electrode 125a and the source/drain areas 121a of the NMOS transistor to apply tensile stress to the channel area, thereby increasing mobility of the electron carrier. The second stress film 135 covers the gate electrode 125b and the source/drain areas 121b of the PMOS transistor to apply compressive stress to the channel area, thereby increasing mobility of the hole carrier.

Meanwhile, the first stress film 131 and the second stress film 135 meet each other in the interface area (III). The area where the first stress film 131 and the second stress film 135 partially overlap while the contact hole 147c formed on the gate electrode 125c is provided between the first stress film and the second stress film may be included in the interface area according to the process margin. FIG. 1 illustrates that the first stress film 131 is provided under the second stress film 135 in the overlapping area. Hereinafter, a description will be given with respect to the first stress film 131 being provided under the second stress film 135 in the overlapping area. However, the order of layering may be changed.

The interlayer insulating film 140 is formed on the first stress film 131 and the second stress film 135. That is, the interlayer insulating film 140 is formed so that the interlayer insulating film is not divided into the NMOS transistor area (I), the PMOS transistor area (II), and the interface area (III). The interlayer insulating film 140 may be formed of, for example, TEOS (tetra ethyl ortho silicate), ozone ($O_3$)-TEOS, USG (undoped silicate glass), PSG (phosphosilicate glass), BSG (borosilicate glass), BPSG (borophosphosilicate glass), FSG (fluoride silicate glass), SOG (spin on glass), TOSZ (tonen silazene), or a combination thereof.

Contact holes 147a, 147b, and 147c are formed in the interlayer insulating film 140, the first stress flint 131, and the second stress film 135 to expose the gate electrodes 125a, 125b, and 125c and/or the source/drain areas 121a and 121b. For example, the contact hole 147a is formed through the interlayer insulating film 140 and the first stress film 131 in the NMOS transistor area (I). The contact hole 147b is formed through the interlayer insulating film 140 and the second stress film 135 in the PMOS transistor area (II). The contact hole 147c is formed through the interlayer insulating film 140, the second stress film 135, and the first stress film 131 in the interface area (III).

Meanwhile, as shown in FIG. 1, lower portions of the contact holes 147a, 147b, and 147c are preferably provided on upper sides of the gate electrodes 125a, 125b, and 125c or the source/drain areas 121a and 121b. However, upper sides of the gate electrodes 125a, 125b, and 125c or the source/drain areas 121a and 121b (for example, upper sides of the silicide films) which are exposed through the contact holes 147a, 147b, and 147c may be recessed according to the fabrication process. In connection with this, the lower portions of the contact holes 147a, 147b, and 147c may be provided on the recessed portion of the upper sides of the gate electrodes or the source/drain areas. Additionally, the depths of the portions; of the upper sides of the gate electrodes 125a, 125b, and 125c or the source/drain areas 121a and 121b which are exposed through the contact holes 147a, 147b, and 147c and are recessed to have the level lower than those of the upper sides in the vicinity of the contact holes 147a, 147b, and 147c may be the same or different in different areas. For example, the depths of the recessed portions may be the same in the NMOS transistor area (I) and the PMOS transistor area (II), but the depth of the recessed portion in interface area (III) may be larger than the former depths. However, the depth of the recessed portion is not limited thereto. Therefore, as the upper sides of the gate electrodes 125a and 125b and the source/drain areas 121a and 121b are not recessed in the NMOS transistor area (I) and the PMOS transistor area (II) or the depths of the recessed portions are lower in comparison with the interface area (III), the margin may be desirably assured so that the upper sides of the gate electrodes 125a and 125b and the source/drain areas 121a and 121b, for example, the silicide films 127a and 127b, are not attacked or removed but contact is stably assured.

Contact plugs 171, 173, and 175 are put into the contact holes 147a, 147b, and 147c. The contact plugs 171, 173, and 175 are electrically connected to the gate electrodes 125a, 125b, and 125c or the source/drain areas 121a and 121b. The contact plugs 171, 173, and 175 may be made of a metal substance such as, for example, tungsten (W), copper (Cu), or aluminum (Al), or a conductive substance such as, for example, conductive polysilicon.

Figure 2:
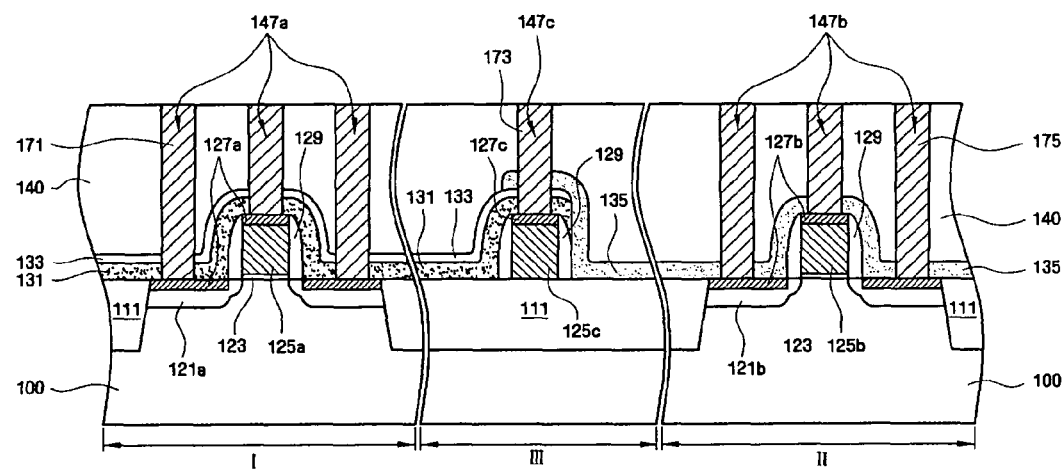
FIG. 2 is a sectional view of a semiconductor device according to an embodiment of the present invention.

FIG. 2 is a sectional view of a semiconductor device according to another embodiment of the present invention. In the present embodiment, a description may be omitted or briefly given of the same structure as the embodiment of FIG. 1, and a difference in constitution will be mainly described.

With reference to FIG. 2, a semiconductor device according to the present embodiment is different from that of the embodiment of FIG. 1 in that an etch stop film 133 is further formed on the first stress film 131. The etch stop film 133 may be formed of, for example, a silicon oxide film, or a LTO (low temperature oxide) film.

The interface area (III) may include the area where the first stress film 131 and the second stress film 135 partially overlap, and the etch stop film 133 may be interposed between the first stress film and the second stress film in this interface area. Accordingly, it can be readily understood that the overlapping area is thicker than that of the embodiment of FIG. 1. Meanwhile, the overlapping area where the etch stop film 133 is provided on the first stress film 131 is shown in FIG. 2, and the structure having the overlapping area will be described. However, the etch stop film 133 may be provided on the second stress film 135. In this case, the order of layering of the first stress film 131 and the second stress film 135 may be changed. Additionally, the modification of the present embodiment may include the etch stop film 133 formed on both the first stress film 131 and the second stress film 135.

Meanwhile, as shown in FIG. 2, the lower portions of the contact holes 147a, 147b, and 147c are preferably provided on the upper sides of the gate electrodes 125a, 125b, and 125c or the source/drain areas 121a and 121b. However, the upper sides of the gate electrodes 125a, 125b, and 125c or the source/drain areas 121a and 121b which are exposed through the contact holes 147a, 147b, and 147c may be recessed according to the fabrication process. In this case, the lower portions of the contact holes 147a, 147b, and 147c may be provided on the recessed portions of the gate electrodes or the source/drain areas. Additionally, the depths of the portions of the upper sides of the gate electrodes 125a, 125b, and 125c or the source/drain areas 121a and 121b which are exposed through the contact holes 147a, 147b, and 147c and are recessed to have the level lower than those of the upper sides in the vicinity of the contact holes 147a, 147b, and 147c may be preferably the same or different in different areas. For example, the depth of the recessed portion in the interface area (III) may be larger than that of the recessed portion in the NMOS transistor area (I). However, the depth of the recessed portion is not limited thereto. The depth of the recessed portion in the PMOS transistor area (II) may depend on the process condition. That is, the depth of the recessed portion in the PMOS transistor area (II) may be larger or smaller than the depth of the recessed portion in the interface area (III).

Meanwhile, in the present embodiment, as the etch stop film 133 is provided on the first stress film 131, in the case where the first stress film 131 and the second stress film 135 have the same thickness, the total thickness of the first stress film 131 and the etch stop film 133 of the NMOS transistor area (I) is larger than that of the second stress film 135. Accordingly, the depths of the recessed portions of the upper sides of the gate electrodes 125a, 125b, and 125c or the source/drain areas 121a and 121b which are exposed through the contact holes 147a, 147b, and 147c in the PMOS transistor area (II) may be larger in comparison with the NMOS transistor area (I).

To control the depths of the recessed portions in the PMOS transistor area (II) and the NMOS transistor area (I) to be the same as each other, the second stress film 135 may be formed to be thicker than the first stress film 131. For example, the thickness of the second stress film 135 may be substantially the same as the total thickness of the first stress film 131 and the etch stop film 133. However, the thickness of the film is not limited thereto. The thickness of the second stress film 135 may be controlled depending on etching selectivity of the etch stop film 133 and the second stress film 135.

Hereinafter, a description will be given of a method of fabricating the above-mentioned semiconductor devices.

FIGS. 3 to 19 are sectional views of intermediate structures at steps of the method of fabricating the semiconductor device according to an embodiment of the present, invention shown in FIG. 1.

Figure 3:
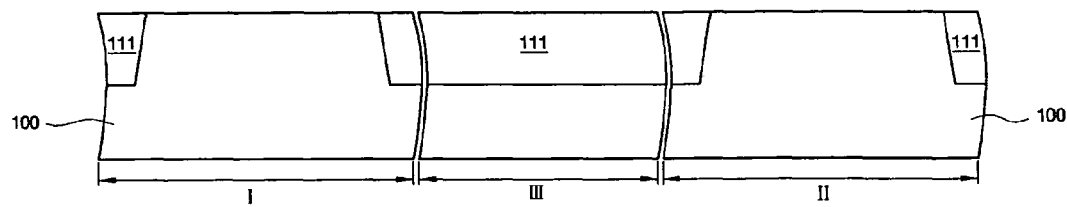
FIGS. 3 to 19 are sectional views illustrating the fabrication of the semiconductor device according to the embodiment of the present invention shown in FIG. 1.

With reference to FIG. 3, the semiconductor substrate 100 is divided into the NMOS transistor area (I), the PMOS transistor area (II), and the interface area (III), and the isolation films 111 are formed in the areas to define active areas. The isolation films 111 may be formed of, for example, a silicon oxide film, and the formation may be performed using, for example, a LOCOS (local oxidation of silicon) process or a SIT (shallow trench isolation) process. As various types of methods of forming the isolation films 111 are known to those who skilled in the art, a detailed description thereof will be omitted.

Meanwhile, the sectional view of FIG. 3 shows the formation of only the isolation film 111 in the interface area (III). Needless to say, however, only the active area may be formed in the interface area (III), or both the isolation film 111 and the active area may be formed in the interface area (III).

Additionally, before or after the isolation films 111 are formed, the NMOS transistor area (I) of the semiconductor substrate 100 may include the p-type impurity doped at a low concentration, and the PMOS transistor area (II) of the semiconductor substrate 100 may include the n-type impurity doped at a low concentration, which are not shown. For example, in the case of when a P-type substrate is used as the semiconductor substrate 100, the n-type impurity may be doped into the PMOS transistor area (II) to form an n-well. In the case of when the P-type substrate is used as the base substrate, the p-type impurity may be doped into the NMOS transistor area (I) to form a p-well.

Figure 4:
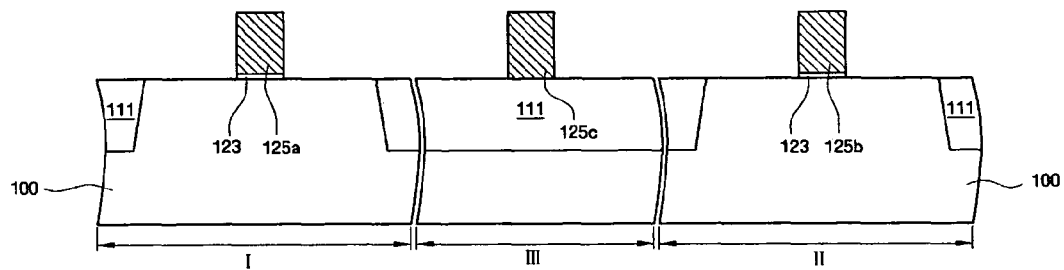

With reference to FIG. 4, an insulating substance layer and a conductive substance layer are formed on the semiconductor substrate 100.

The insulating substance layer may be, for example, a silicon oxide film. The application may be performed by, for example, a thermal oxidation process, chemical vapor deposition (CVD), low pressure chemical vapor deposition (LPCVD), or plasma enhanced chemical vapor deposition (PECVD).

The conductive substance may be, for example, polysilicon or metal into which n-type or p-type impurity is doped. The application may be performed by, for example, low pressure CVD (LPCVD), atomic layer deposition (ALD), physical vapor deposition (PVD), or metal organic CVD (MOCVD). Hereinafter, in the case where polysilicon is used as the conductive substance will be described.

The conductive substance layer and the insulating substance layer are patterned to form the gate electrodes 125a, 125b, and 125c, and the gate insulating film 123.

Figure 5:
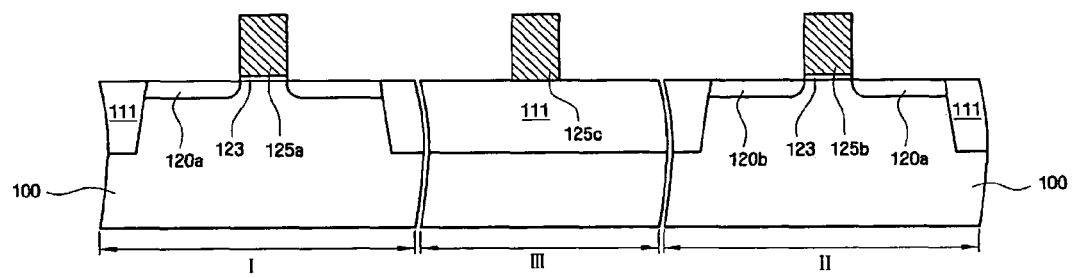

Subsequently, the source/drain areas are formed in the active areas of the semiconductor substrate 100, and the silicide films are formed on the upper sides of the gate electrodes 125a, 125b, and 125c and the source/drain areas. FIGS. 5 to 8 illustrate the formation of the source/drain areas and the silicide films. With reference to FIG. 5, the low concentration n-type impurity (see reference numeral 120a) is doped into the active area of the NMOS transistor area (I), and the low concentration p-type impurity (see reference numeral 120b) is doped into the active area of the PMOS transistor area (II). For example, when the low concentration n-type impurity is doped, a photoresist film covers the PMOS transistor area (II) to dope the n-type impurity into only the NMOS transistor area (I). When the low concentration p-type impurity is doped, the photoresist film covers the NMOS transistor area (II) to dope the p-type impurity into only the PMOS transistor area (I).

Figure 6:
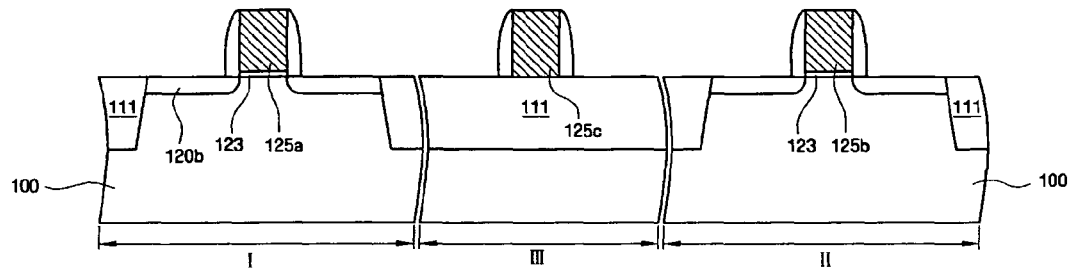

With reference to FIG. 6, the spacers 129 are formed on walls of the gate electrodes 125a, 125b, and 125c, and the gate insulating films 123. The spacers 129 may be formed of, for example, a silicon nitride film. The silicon nitride film may be layered on the semiconductor substrate 100 and an etch back process may be performed to form the spacers 129. The spacers 129 are arranged so that the upper side of the gate electrode is exposed and the upper sides of the spacers 129 are put on the same horizontal plane as the upper sides of the gate electrodes 125a, 125b, and 125c. Hereinafter, the above-mentioned structure will be described. However, the spacer 129 may be recessed so that the upper side of the spacer is lower than the upper sides of the gate electrodes 125a, 125b, and 125c to readily form the silicide film. Alternatively, the spacer 129 may be formed so as to cover the upper sides of the gate electrodes 125a, 125b, and 125c.

Figure 7:
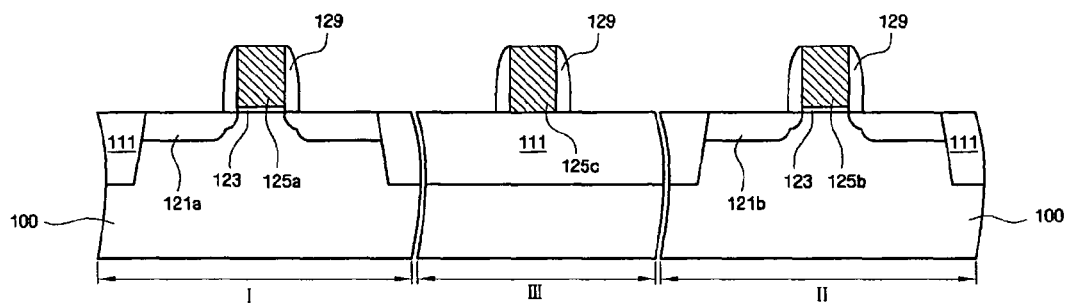

With reference to FIG. 7, the high concentration n-type impurity is doped into the active area of the NMOS transistor area (I), and the high concentration p-type impurity is doped into the active area of the PMOS transistor area (II). For example, when the high concentration n-type impurity is doped, the photoresist film covers the PMOS transistor area (II) and the gate electrodes 125a, 125b, and 125c and the spacer 129 are doped using a doping mask, thereby doping the high concentration n-type impurity into only the exposed active area of the NMOS transistor area (I). Additionally, when the high concentration p-type impurity is doped, the photoresist film covers the NMOS transistor area (I) and the gate electrodes 125a, 125b, and 125c and the spacer 129 are doped using the doping mask, thereby doping the high concentration p-type impurity into only the PMOS transistor area (II). As a result, the source/drain areas 121a and 121b including the high concentration doping area and the low concentration doping area are formed.

Figure 8:
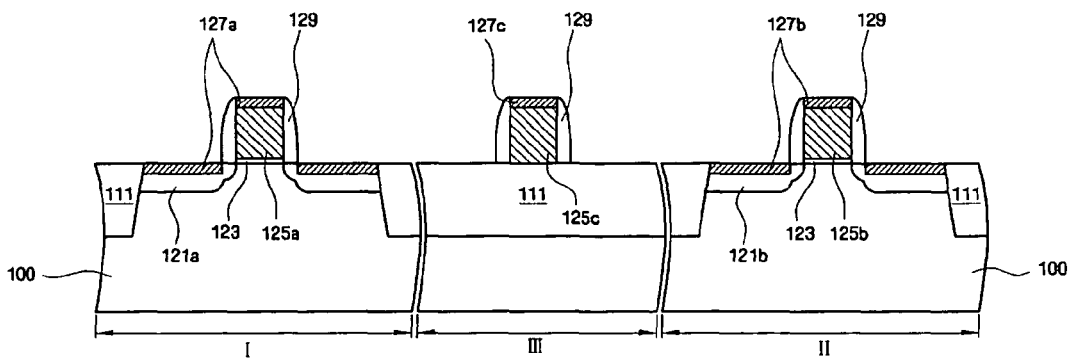

With reference to FIG. 8, the upper sides of the gate electrodes 125a, 125b, and 125c and the exposed upper sides of the source/drain areas 121a and 121b are subjected to silicidation. A metal film for silicidation, for example, metal such as tungsten (W), cobalt (Co), nickel (Ni), titanium (Ti), and tantalum (Ta), may be formed on the semiconductor substrate 100 and then subjected to heat treatment to perform the silicidation. For example, in the case of when the gate electrodes 125a, 125b, and 125c are formed of polysilicon, the upper sides of the source/drain areas 121a and 121b and the upper sides of the gate electrodes 125a, 125b, and 125c may be silicidated by the heat treatment of the semiconductor substrate 100. Subsequently, the metal film for silicidation that is not silicidated on the semiconductor substrate 100 may be removed to form the self-aligned silicide films 127a, 127b, and 127c on the upper sides of the gate electrodes 125a, 125b, and 125c and the exposed upper skies of the source/drain areas 121a and 121b.

Subsequently, the first stress film 131 is formed in the NMOS transistor area (I), and the second stress film 135 is formed in the PMOS transistor area (II). In connection with this, the first stress film 131 and the second stress film 135 are set to partially overlap each other in the interface area (III) in consideration of the process margin. More specific processes are shown in FIGS. 9 to 12.

Figure 9:
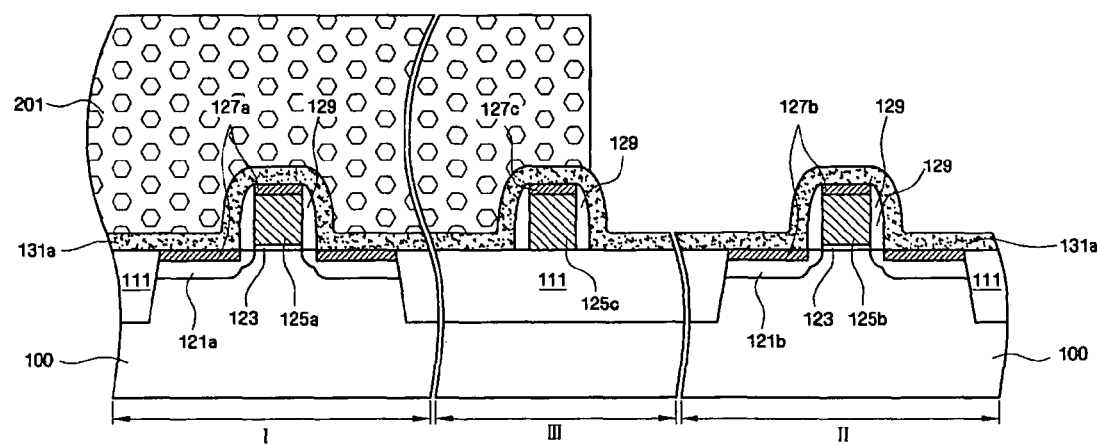

With reference to FIG. 9, a first stress film 131a is formed on the resulting structure of FIG. 8. The first stress film 131a may be, for example, a tensile stress film. The first stress film 131a may be formed of, for example, SiN, SiON, SiBN, SiC, SiC:H, SiCOH, SiCN, $SiO_2$, or a combination thereof. The first stress film 131a may have a thickness in the range of about 1 to about 1,000 angstroms (Å), and may be formed by, for example, CVD (chemical vapor deposition), thermal CVD, PECVD (plasma enhanced CVD), or high density plasma CVD. For example, the first stress film 131a made of SiN may be formed by a silicon source gas such as silane ($SiH_4$) and a nitrogen source gas such as ammonia ($NH_3$) and nitrogen ($N_2$) at a temperature of about 300 to about 600° C. and a pressure of about 1 to about 10 torr. Tensile stress of the layered first, stress film 131a may be controlled using a deposition condition or a composition ratio of substances constituting the film. For example, the stress may be controlled to the range of about 0.01 to about 5 GPa.

Subsequently, a first photoresist pattern 201 is formed on the first stress film 131a. The first photoresist pattern 201 covers the entire surface of the NMOS transistor area (I) while tire PMOS transistor area (II) is exposed. Additionally, the first photoresist pattern 201 may be formed to cover a portion of the gate electrode 125c of the interface area (III), and preferably the entire gate electrode, so as to assure the process margin, that is, to completely cover the entire NMOS transistor area (I).

Figure 10:
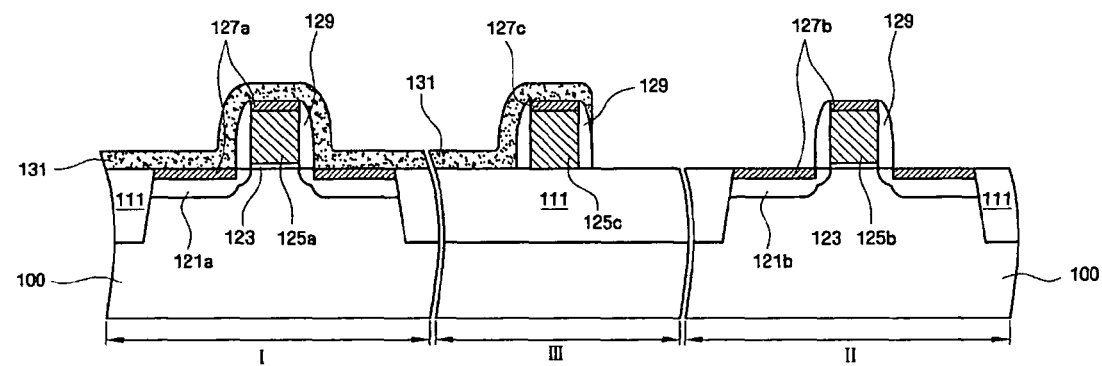

With reference to FIG. 10, the first stress film 131a is etched using the first photoresist pattern 201 as an etching mask. The etching may be performed using, for example, a dry etching process or a wet etching process. As shown in FIG. 10, the first stress film (see reference numeral 131) is formed in the NMOS transistor area (I) and the first stress film 131a is removed from the PMOS transistor area (II) resulting from the etching. The first stress film (see reference numeral 131) is formed in the interface area (III) so that the first stress film overlaps a portion of the gate electrode 125c. Subsequently, an ashing process or a strip process is performed to remove the first photoresist pattern 201.

Figure 11:
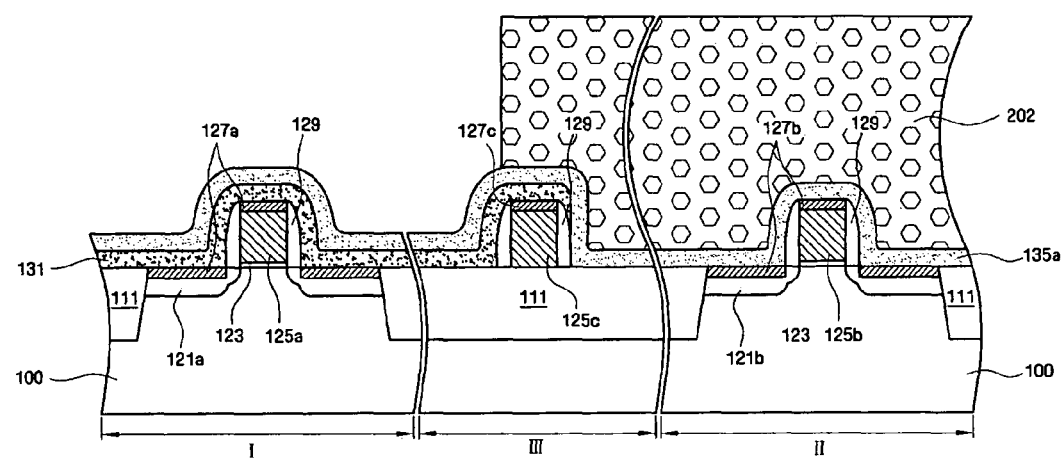

With reference to FIG. 11, a second stress film 135a is formed on the resulting structure of FIG. 10. The second stress film 135a may be, for example, a compressive stress film. The second stress film 135a may be formed of, for example, SiN, SiON, SiBN, SiC, SiC:H, SiCOH, SiCN, $SiO_2$, or a combination film thereof like the first stress film 131a. The process that is used to form the second stress film 135a may be the same as that of the first stress film 131a. However, the deposition condition of the second stress film 135a or a composition ratio of substances constituting the film are controlled so that the second stress film 135a has the stress different from that of the first stress film. For example, the compressive stress of the second stress film 135a may be about −0.01 to about −5 GPa.

The second stress film 135a may have a thickness in the range of about 1 to about 1,000 Å. Preferably, the thickness of the second stress film 135a may be substantially the same as the thickness of the first stress film 131.

Subsequently, a second photoresist pattern 202 is formed on the second stress film 135a. The second photoresist pattern 202 covers the entire surface of the PMOS transistor area (II) while the NMOS transistor area (II) is exposed. Additionally, the second photoresist pattern 202 may be formed to cover a portion of the gate electrode 125c of the interface area (III), and preferably the entire gate electrode, so as to assure the process margin, that is, to completely cover the entire PMOS transistor area (II).

Figure 12:
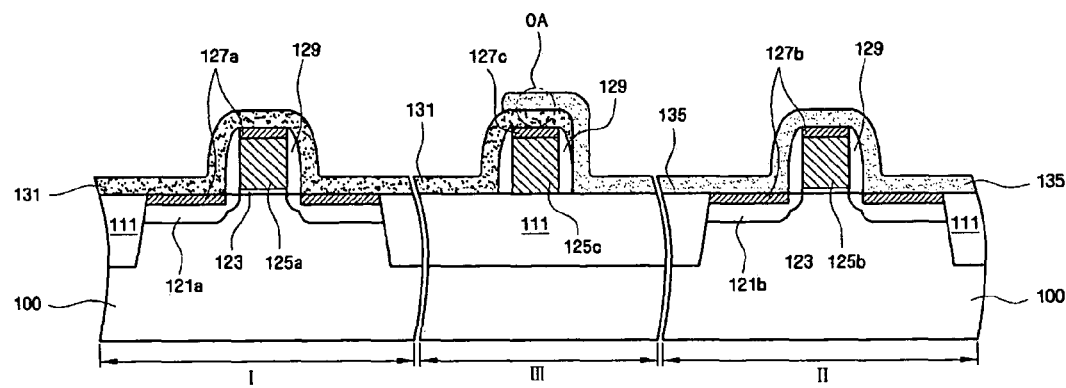

With reference to FIG. 12, the second stress film 135a is etched using the second photoresist pattern 202 as an etching mask. The etching of the second stress film 135a may be performed using, for example, a dry etching process or a wet etching process. As shown in FIG. 12, the second stress film (see reference numeral 135) is formed in the PMOS transistor area (II) and the second stress film 135a is removed from the NMOS transistor area (I) resulting from the etching. The second stress film (see reference numeral 135) is formed in the interface area (III) so that the second stress film overlaps a portion of the gate electrode 121c. Accordingly, the interface area (III) may include an overlapping area (OA) where the first stress film 131 and the second stress film 135 are layered on the gate electrode 121c so as to overlap each other.

Figure 13:
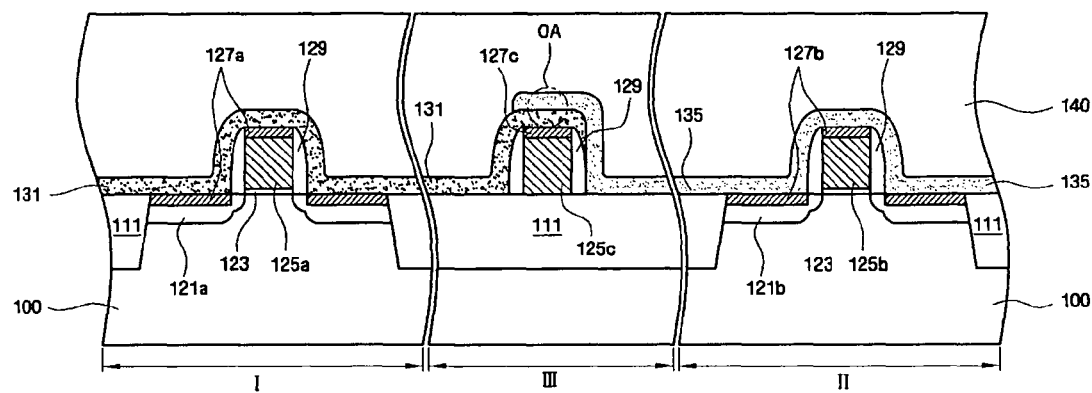

With reference to FIG. 13, an interlayer insulating film 140 is formed on the resulting structure of FIG. 12. The interlayer insulating film 140 may be formed of for example, TEOS (tetra ethyl ortho silicate), $O_3$-TEOS, $SiO_2$, SiON, SiOC, or a combination thereof. For example, the formation may be performed using processes such as, for example, CVD or spin coating.

Figure 14:
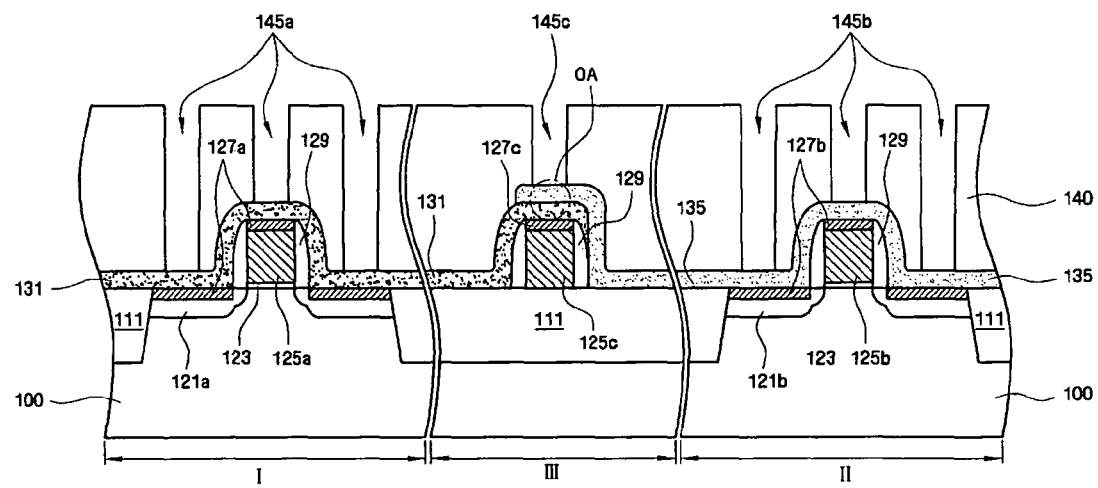

With reference to FIG. 14, the interlayer insulating film 140 is patterned to form preliminary contact holes 145a, 145b, and 145c in the NMOS transistor area (I), the PMOS transistor area (II), and the interface area (III). The preliminary contact holes 145a, 145b, and 145c are formed to correspond to the gate electrodes 125a, 125b, and 125c in the regions and/or the source/drain areas 121a and 121b so that the first stress film 131 or the second stress film 135 are exposed therethrough. For example, the preliminary contact hole 145a of the NMOS transistor area (I) is formed so that the first stress film 131 is exposed through the preliminary contact hole 145a of the NMOS transistor area (I), and the second stress film 135 is exposed through the preliminary contact hole 145b of the PMOS transistor area (II). In the case where the first stress film 131 and the second stress film 135 overlap in the interface area (III), the preliminary contact hole 145c may be formed so that the second stress film 135 provided on the upper layer of the overlapping area (OA) is exposed through the preliminary contact hole 145c.

The interlayer insulating film 140 may be patterned by a photolithography process using, for example, a photoresist pattern. The etching may be performed using, for example, a dry etching process or a wet etching process. Preferably, the dry etching may be used. In the case of when an etching gas or an etchant in which the etching selectivity to the interlayer insulating film 140 is higher than the etching selectivities to the first stress film 131 and the second stress film 135 is used, the first stress film 131 and the second stress film 135 may act as the process stopper during the etching of the interlayer insulating film 140.

Figure 15:
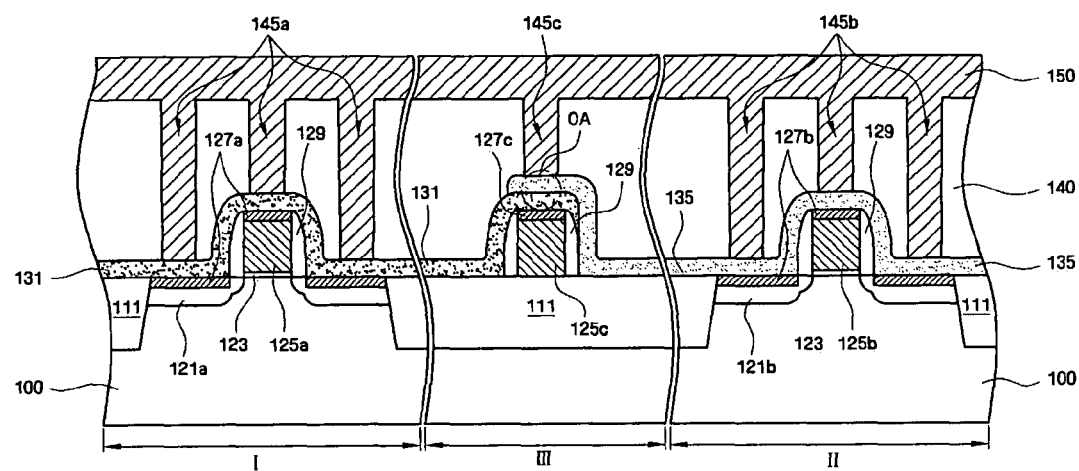

With reference to FIG. 15, the preliminary contact holes 145a, 145b, and 145c are filled with a filling material 150 containing an organic material. Preferably, an organic material that has a beneficial gapfill ability and is capable of fully filling the relatively narrow and deep preliminary contact holes may be used as the filling material 150. Examples of the organic material may include SOP (spin on polymer). For example, the organic material may include a polyarylene ether-based material, a polymethamethylacrylate-based material, and a vinylether methacrylate-based material. Additionally, a typical organic material for bottom anti-reflective coating (BARC) which is layered before a photoresist film is formed during a photolithography process may be used as the filling material 150. However, the filling material is not limited to the above-mentioned examples.

Figure 16:
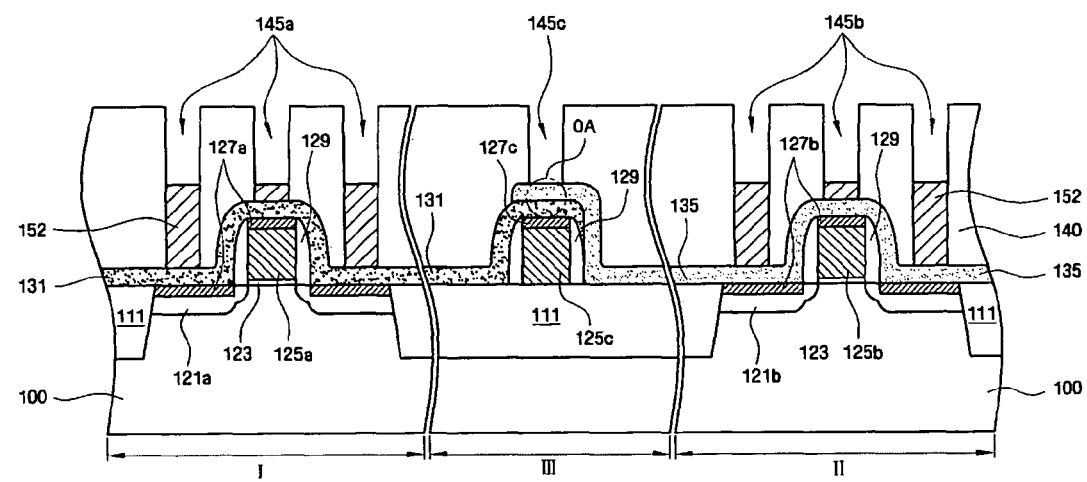

With reference to FIG. 16, the filling material 150 which is put in the preliminary contact holes 145a, 145b, and 145c is entirely removed to expose the second stress film 135 of the interface area (III). This step may be performed using, for example, an etchback process or an ashing process. In connection with this, the filling material 150 is removed so as not to expose the first stress film 131 of the NMOS transistor area (I) and the second stress film 135 of the PMOS transistor area (II). That is, if the filling material 150 which is put in the preliminary contact holes 145a, 145b, and 145c is continuously removed at the constant removing speed, the second stress film 135 of the interface area (III) where the first stress film 131 and the second stress film 135 overlap is first exposed because the second stress film 135 is highest. In connection with this, the etchback process or the ashing process is stopped after the second stress film 135 is exposed to selectively expose only the second stress film 135 in the interface area (III). The filling material 152 remains in the preliminary contact holes 145a and 145b of the NMOS transistor area (I) and the PMOS transistor area (II).

The etchback process or the ashing process may be performed using, for example, the second stress film 135 of the interface area (III) as a process stopper. However, the process stopper is not limited to the above-mentioned example. The etchback process or the ashing process may be stopped using, for example, the time control or an end point detector (EPD).

Figure 17:
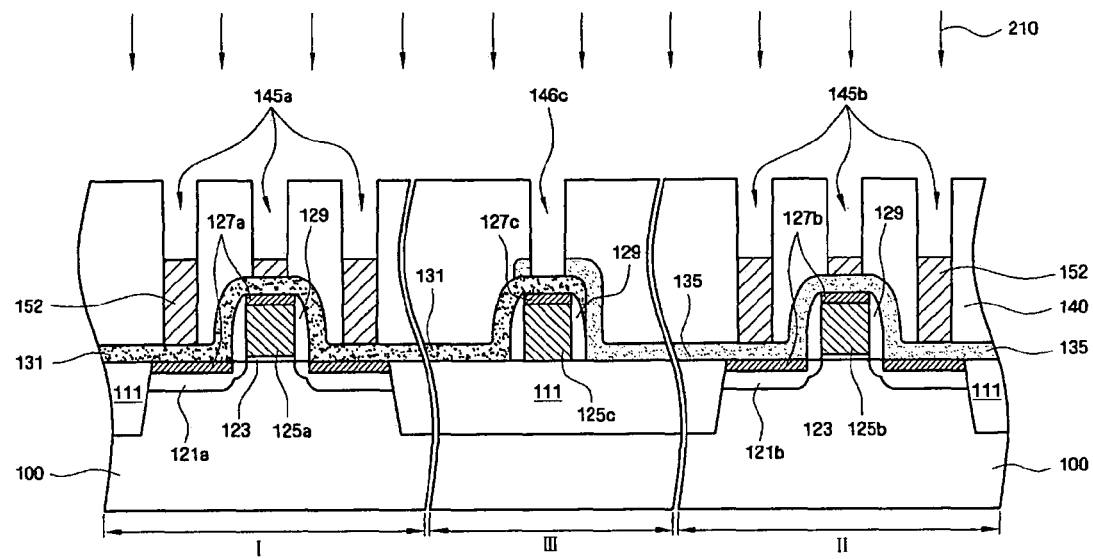

With reference to FIG. 17, the exposed second stress film 135 is removed from the interface area (III). The removal of the exposed second stress film 135 may be performed using dry etching or wet etching. In connection with this, the etching gas or the etchant where the etching selectivity to the second stress film 135 is higher than the etching selectivities to the interlayer insulating film 140 and the filling material 152 is used to selectively remove only the exposed second stress film 135. The etching selectivity may be, for example, about 20:1 or more.

If the first stress film 131 is exposed after the second stress film 135 is removed, the etching is stopped to form the preliminary contact hole 146c through which the first stress film 131 is exposed. The etching may be stopped using the first stress film 131 as the process stopper. However, in the case of when a difference in etching selectivity of them is insignificant, the above-mentioned time control or end point detector may be used. Meanwhile, in a modification of the present embodiment, a portion of the second stress film 135 may be removed so as not to expose the first stress film 131 through the preliminary contact hole 146c.

Subsequently, the entire filling material 152 which remains in the contact hole of the NMOS transistor area (I) and the preliminary contact holes 145a and 145b of the PMOS transistor area (II) is removed. The filling material 152 may be removed using, for example, an oxygen ($O_2$) plasma ashing process, a hydrogen-based ($H_2$ based) plasma ashing process, or an etchback process (see reference numeral 210). However, the removal process is not limited thereto.

Figure 18:
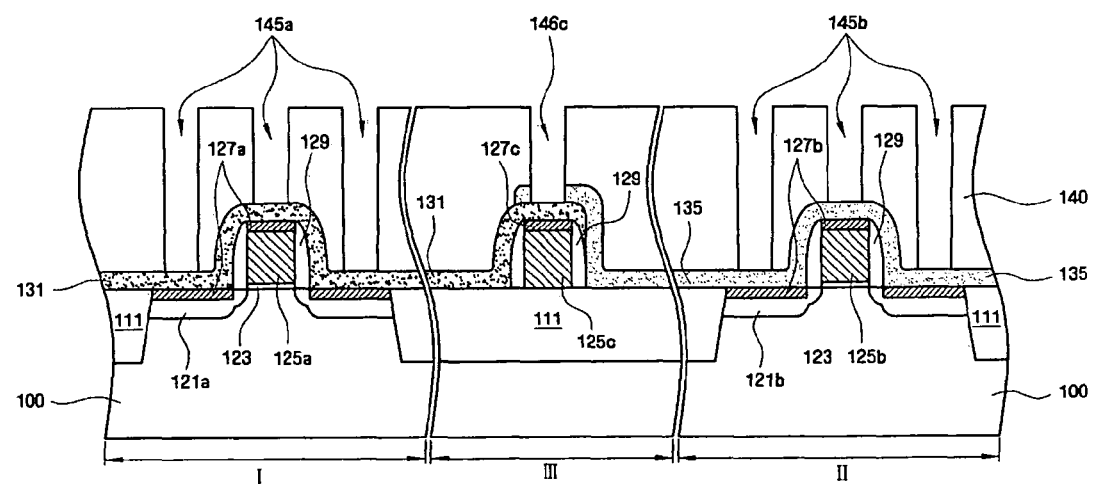

With reference to FIG. 18, the filling material 152 is removed to expose the first stress film 131 through the preliminary contact hole 145a of the NMOS transistor area (I) and to expose the second stress film 135 through the preliminary contact hole 145b of the PMOS transistor area (II). After the filling material 150 is removed, the preliminary contact holes 145a, 145b, and 145c may be washed using, for example, an organic solvent to remove particles from the preliminary contact holes 145a, 145b, and 145c.

Figure 19:
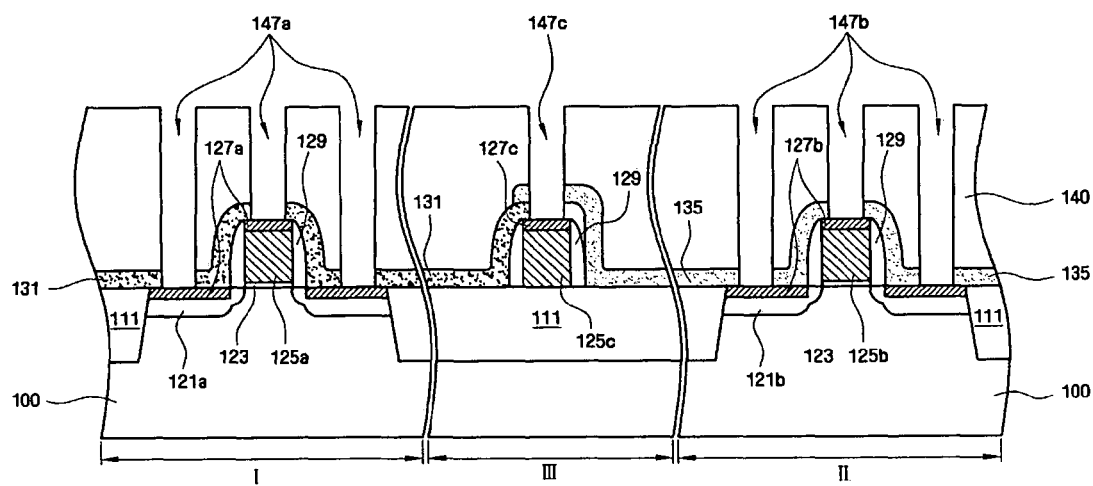

With reference to FIG. 19, the exposed first stress film 131 is removed from the NMOS transistor area (I) and the interface area (III) and the exposed second stress film 135 is removed from the PMOS transistor area (II) to form the contact holes 147a, 147b, and 147c through which the gate electrodes 125a, 125b, and 125c and/or the source/drain areas 121a and 121b are exposed in the different regions. The removal of the first stress film 131 and the second stress film 135 may be performed using, for example, the dry etching or the wet etching. Preferably, the etching gas or the etchant where the etching selectivities to the first stress film 131 and the second stress film 135 are the same as each other may be used to perform the etching.

In the case where the thicknesses of the first stress film 131 and the second stress film 135 layered during the steps of FIGS. 9 and 11 are substantially the same as each other, the thickness of the exposed first stress film 131 of the NMOS transistor area (I) and the interface area (III) may be substantially the same as the thickness of the exposed second stress film 135 of the PMOS transistor area (II). Accordingly, if the etching gas or the etchant where etching rates to the first stress film 131 and the second stress film 135 are the same as each other is used, the contact holes 147a, 147b, and 147c are simultaneously formed in the different regions. That is, as it is unnecessary to overetch the contact holes which are already formed to form all the contact holes 147a, 147b, and 147c in the different regions, it is possible to prevent the gate electrodes 125a, 125b, and 125c and/or the source/drain areas 121a and 121b from being attacked. For example, the silicide films 127a, 127b, and 127c on the upper sides of the gate electrodes 125a, 125b, and 125c and the source/drain areas 121a and 121b are prevented from being attacked or removed. Thereby, the contact characteristics are improved.

Meanwhile, to remove all the first stress film 131 and the second stress film 135 from the contact hole areas 147a, 147b, and 147c, the etching may be performed for a predetermined time in addition to the calculated etching time. At this step, the exposed upper sides of the gate electrodes 125a, 125b, and 125c and the source/drain areas 121a and 121b may be partially recessed. Preferably; the depths of the recessed portions of the NMOS transistor area (I), the PMOS transistor area (II), and the interface area (III) may be the same as each other. However, at the step of FIG. 17, in the case of when the additional etching is performed to entirely remove the second stress film 135 of the interface area (III), a portion of the first stress film 131 provided under the second stress film may be recessed to reduce the thickness. Therefore, the contact hole 147c of the interface area (III) may be formed before the formation of the contact holes 147a and 147b in the NMOS transistor area (I) or the PMOS transistor area (II) to expose the gate electrodes 125a and 125b. That is, the gate electrode 125c of the interface area (III) may be exposed to the etching process for a longer time in comparison with the other areas. Accordingly, the depth of the recessed portion may be larger as compared to the other areas. However, even if the additional etching is performed, the depths of the recessed portions of the upper sides of the gate electrodes 125a, 125b, and 125c and the source/drain areas 121a and 121b are lower in comparison with the case of when the second stress film 135 is not removed in advance. Therefore, the contact characteristics are improved.

Turning to FIG. 1, the contact plugs 171, 173, and 175 are formed in the contact hole 147a, 147b, and 147c. The contact plugs 171, 173, and 175 are made of a metal substance such as, for example, W, Cu, or Al, or a conductive substance such as, for example, conductive polysilicon. The contact plugs 171, 173, and 175 may be formed by means of the above-mentioned substance using, for example, low pressure CVD (LPCVD), atomic layer deposition (ALD), physical vapor deposition (PVD), metal organic CVD (MOCVD), electrolytic plating, or electroless plating. If necessary, the planarization process such as, for example, CMP (chemical mechanical polishing) or etchback may be performed until the surface of the interlayer insulating film 140 is exposed, thereby fabricating the semiconductor device shown in FIG. 1.

Figure 20:
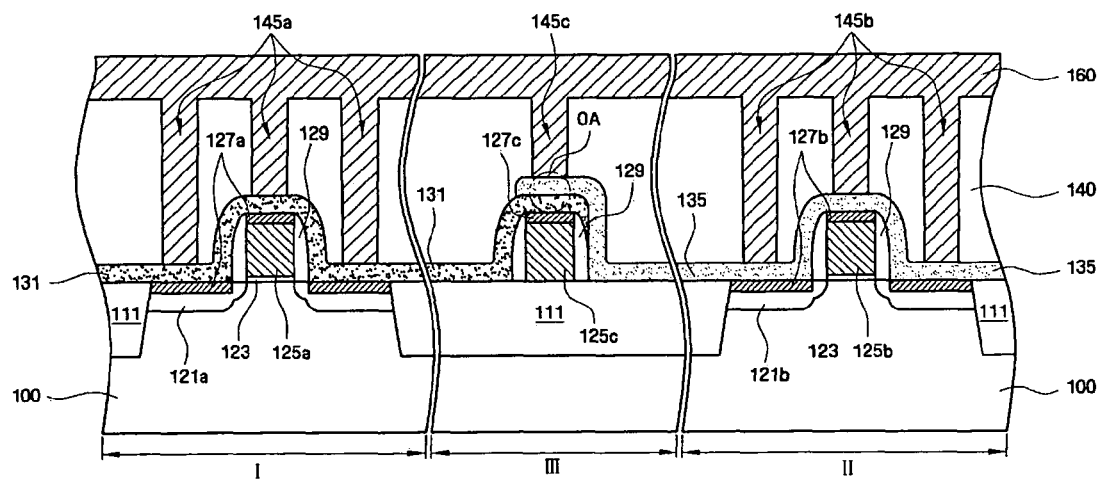
FIGS. 20 to 22 are sectional views illustrating the fabrication of the semiconductor device according to the embodiment of the present invention shown in FIG. 1.
Figure 21:
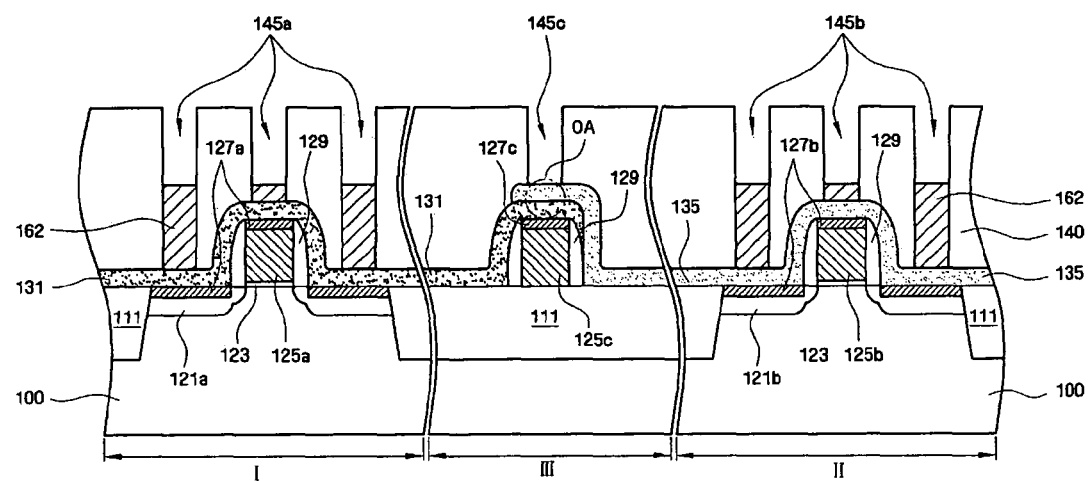
Figure 22:
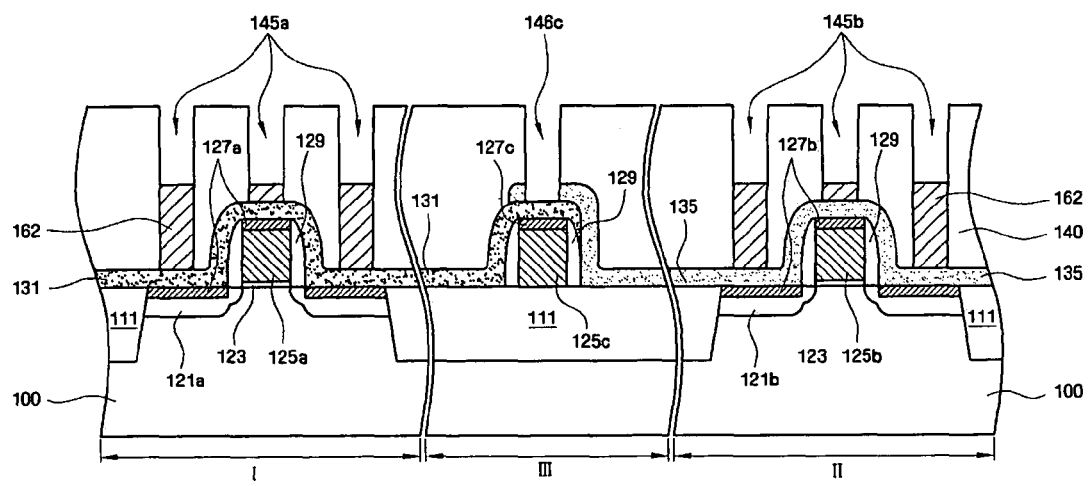

FIGS. 20 to 22 are sectional views of intermediate structures at steps of the method of fabricating the semiconductor device according to another embodiment of the present invention shown in FIG. 1. The method of fabricating the semiconductor device according to the present embodiment is different from that of the embodiment of FIGS. 3 to 19 in that an inorganic material is used as the filling material filling the preliminary contact holes.

For example, the method of fabricating the semiconductor device according to the present embodiment is the same as that of the embodiment of FIGS. 3 to 14, with the exception of the steps alter the formation of the preliminary contact holes in the NMOS transistor area (I), the PMOS transistor area (II), and the interface area (III). With reference to FIG. 20, the preliminary contact holes 145a, 145b, and 145c are filled with the filling material 160 made of the inorganic material. A material that has beneficial gapfill ability and is capable of being readily removed during the subsequent process because the etching selectivity to the interlayer insulating film 140 around the filling material is high may be used as the inorganic material. For example, a HSQ-based material (hydrogensilsesquioxane-based material) or an MSQ-based material (methyl silsesquioxane-based material) may be used.

With reference to FIG. 21, the filling material 160 which is put in the preliminary contact holes 145a, 145b, and 145c is removed to expose the second stress film 135 of the interface area (III). The removal is performed using the etchback process. In connection with this, it is preferable to use the etching gas where the etching selectivity to the filling material 160 is higher than the etching selectivity to the interlayer insulating film 140. For example, the ratio of the etching selectivities may be about 10:1 or more, and preferably about 20:1 or more. Other conditions are substantially the same as those of the step of FIG. 16.

With reference to FIG. 22, the exposed second stress film 135 is removed from the interface area (III). The removal of the exposed second stress film 135 may be performed using, for example, the dry etching or the wet etching. In connection with this, the etching gas or the etchant where the etching selectivity to the second stress film 135 is higher than the etching selectivities to the interlayer insulating film 140 and the filling material 162 may be used to selectively remove only the exposed second stress film 135.

Subsequently, the filling material 162 which remains in the preliminary contact hole 145a of the NMOS transistor area (I) and in the preliminary contact hole 145b of the PMOS transistor area (II) is entirely removed. The removal of the filling material 162 may be performed using, for example, the wet removing process in which the etchant having the high selectivity is used to remove the filling material 162. For example, the wet etching may be performed using a dipping process by means of a hydrogen fluoride (HF) solution that is diluted with deionized water at a ratio of about 100:1 or more, a BOE (buffered oxide etchant) that is a mixed solution of ammonium fluoride ($NH_4F$), HF, and deionized water, or an organic solution containing dimethylacetylamide. The subsequent process is performed as shown in FIGS. 18, 19, and 1 to fabricate the semi conductor device.

FIGS. 23 to 27 are sectional views of intermediate structures at steps of the method of fabricating the semiconductor device according to the embodiment of the present invention shown in FIG. 2. In the present embodiment, a description of the intermediate structures that are the same as those of the embodiment of FIGS. 3 to 19 or are readily analogized from those of the embodiment of FIGS. 3 to 19 will be omitted, and a difference in constitution will be mainly described.

Figure 23:
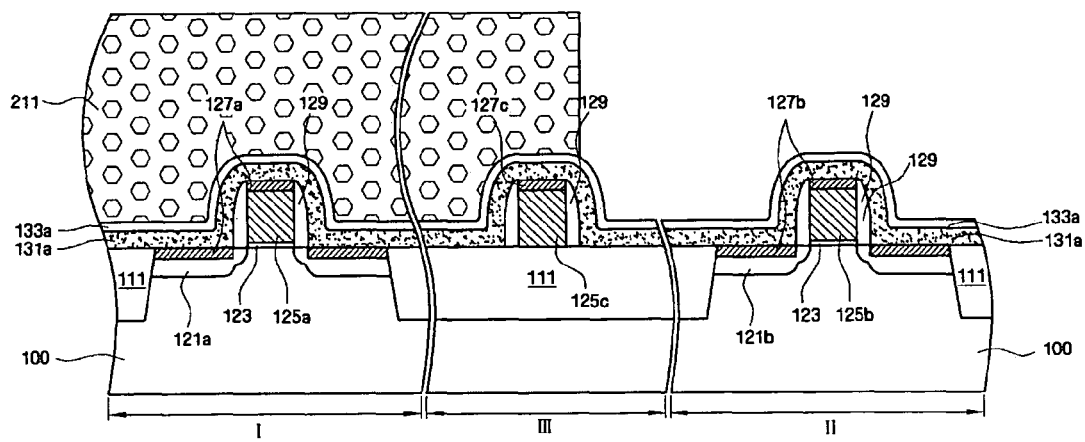
FIGS. 23 to 27 are sectional views illustrating the fabrication of the semiconductor device according to the embodiment of the present invention shown in FIG. 1.

The method of fabricating the semiconductor device according to the present embodiment is substantially the same as that of the embodiment of FIGS. 3 to 8, with the exception of the processes after the silicidation of the upper sides of the gate electrodes and the source/drain areas. With reference to FIG. 23, the first stress film 131 and the etch stop film 133a are formed. The first stress film 131 is formed through the same procedure as the embodiment of FIG. 9. For example, the etch stop film 133a may be formed of a silicon oxide film such as an LTO film. Subsequently, a third photoresist pattern 211 is formed on the etch stop film 133a. The third photoresist pattern 211 is substantially the same as the first photoresist pattern 201 of FIG. 9 except that the third photoresist pattern 211 is formed on the etch stop film 133a.

Figure 24:
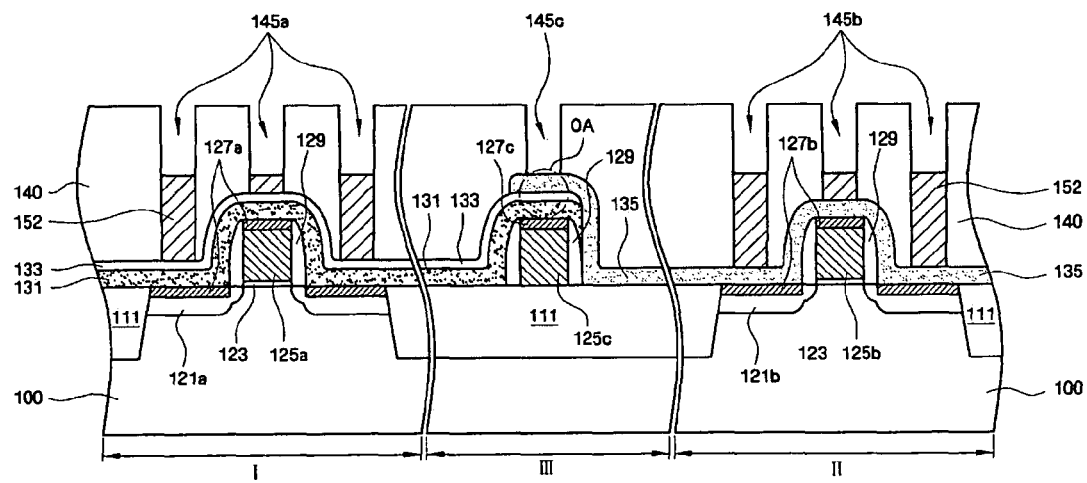

With reference to FIG. 24, after the etch stop film 133a and the first stress film 131 are patterned using the third photoresist pattern 211 as an etching mask, the third photoresist pattern 211 is removed. Subsequently, as shown in FIGS. 11 and 12, the second stress film 135 is formed on the resulting structure, and the patterning is performed. In connection with this, the thickness of the second stress film 135 may be controlled to be larger than the thickness of the first stress film 131 by the thickness of the etch stop film 133. However, the thickness of the second stress film is not limited thereto. Subsequently, the interlayer insulating film 140 is formed, the preliminary contact holes 145a, 145b, and 145c are formed, the preliminary contact holes 145a, 145b, and 145c are filled with the filling material 152, and the filling material 152 is removed to expose the second stress film 135. These steps are substantially the same as those of FIGS. 13 to 16 except that the etch stop film 133 is formed on the upper sides of the first stress film 131. Accordingly, the first stress film 131, the etch stop film 133, and the second stress film 135 overlap in the exposed area of the interface area (III).

Figure 25:
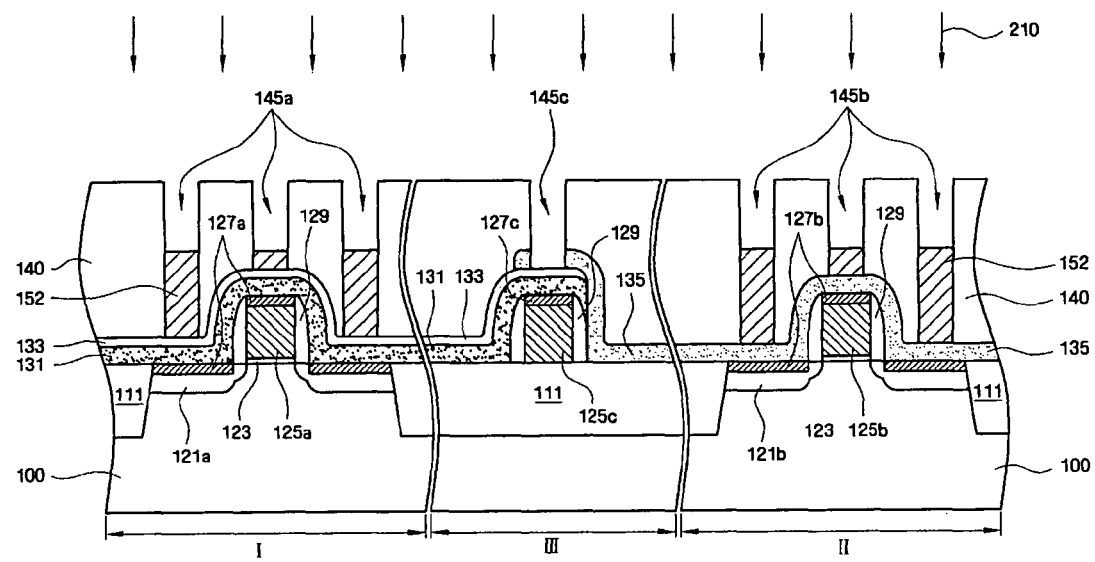

With reference to FIG. 25, the exposed second stress film 135 is removed from the interface area (III). This step is substantially the same as that of FIG. 17. However, this step is different from that of FIG. 17 in that the removal of the second stress film 135 is performed using the etch stop film 133 as the stopper. Accordingly, it is possible to stably control the etching. Subsequently, the filling material 152 that remains in the preliminary contact hole 145a of the NMOS transistor area (I) and in the preliminary contact hole 145b of the PMOS transistor area (II) is entirely removed.

Figure 26:
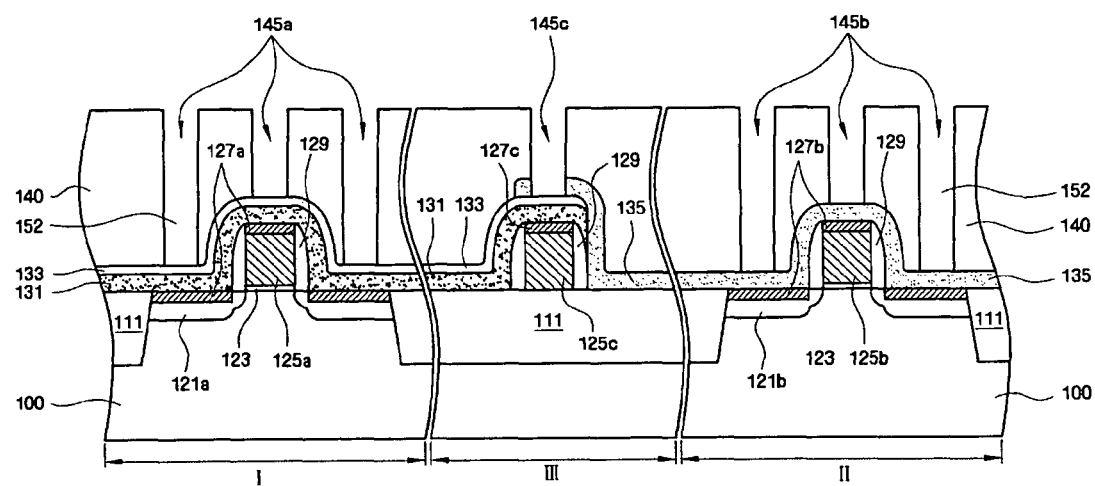

With reference to FIG. 26, the filling material 152 is removed to expose the etch stop film 133 through the preliminary contact hole 145a of the NMOS transistor area (I) and to expose the second stress film 135 through the preliminary contact hole 145b of the PMOS transistor area (II). After the filling material 152 is removed, the preliminary contact holes 145a, 145b, and 145c may be washed using, for example, an organic solvent to remove particles from the preliminary contact holes 145a, 145b, and 145c.

Figure 27:
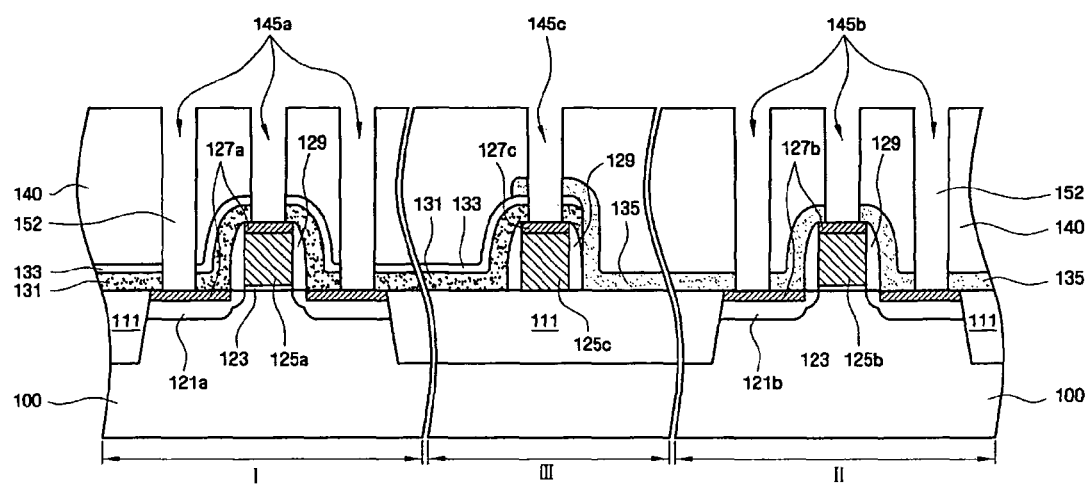

With reference to FIG. 27, the exposed etch stop film 133 and first stress film 131 are removed from the NMOS transistor area (I) and the interface area (III) and the exposed second stress film 135 is removed from the PMOS transistor area (II) to form the contact holes 147a, 147b, and 147c through which the gate electrodes 125a, 125b, and 125c and/or the source/drain areas 121a and 121b are exposed in the different regions. In connection with this, as the etch stop film 133 is provided on the first stress film 131, it can be seen that the depths of the recessed portions of the upper sides of the gate electrode 125c of the interface area (III) and the gate electrode 125a and the source/drain areas 121a of the NMOS transistor area (I) are reduced in comparison with the embodiment of FIG. 19. Furthermore, if the second stress film 135 is set to be thicker than the first stress film 131 and the etching condition including the etching gas is controlled so that the time required to entirely etch the etch stop film 133 and the first stress film 131 in the NMOS transistor area (I) is the same as the time required to etch the second stress film 135 in the PMOS transistor area (II), the depths of the recessed portions may be controlled to be the same in the different areas.

Subsequently, the contact, plugs 171, 173, and 174 are formed in the contact holes 147a, 147b, and 147c to fabricate the semiconductor device shown in FIG. 2.

Meanwhile, in the present embodiment, the organic material is used as the filling material 152. However, the inorganic material may be used like the embodiment of FIGS. 20 to 22.

In a semiconductor device and a method of fabricating the semiconductor device according to the embodiments of the present invention, an overlapping region of a first stress film and a second stress film having a relatively higher thickness is first removed during the formation of contact holes. Thereby, it is possible to control the stress films so that the thicknesses of the stress films to be removed are substantially the same. Accordingly, an attack to a lower structure such as an upper side of a gate electrode and upper sides of source/drain areas due to the formation of the contact holes may be reduced. Therefore, it is possible to improve contact characteristics and the reliability of a semiconductor device.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of fabricating a semiconductor device, the method comprising:
   forming a first stress film covering a first gate electrode and first source/drain areas of a first transistor area of a semiconductor substrate and at least a portion of a third gate electrode of an interface area between the first transistor area and a second transistor area;
   forming a second stress film covering a second gate electrode and second source/drain areas of the second transistor area of the semiconductor substrate and overlapping at least a portion of the first stress film on the third gate electrode of the interface area;
   forming an interlayer insulating film on the semiconductor substrate;
   patterning the interlayer insulating film to form a plurality of preliminary contact holes through which the first stress film on the first gate electrode and the first source/drain areas and the second stress film on the second and the third gate electrodes and the second source/drain areas are exposed;
   filling the plurality of preliminary contact holes with a filling material;
   removing the filling material to expose the second stress film in the interface area while the filling material remains in the preliminary contact holes of the first transistor area and the second transistor area;
   removing the exposed second stress film of the interface area;
   removing the remaining filling material to expose the first stress film of the first transistor area and the second stress film of the second transistor area; and
   removing the exposed first stress film and second stress film to form a plurality of contact holes through which the first, the second, and the third gate electrodes, and the first and the second source/drain areas are exposed.

2. The method of claim 1, wherein:
   the filling material is formed of an organic material; and
   the removing of the filling material is performed using an etchback process or an ashing process.

3. The method of claim 2, wherein the organic material is a polyarylene ether-based material, a polymethamethylacrylate-based material, or a vinylether methacrylate-based material.

4. The method of claim 1, wherein:
   the filling material is formed of an inorganic material; and the removing of the filling material is performed using a wet etching process.

5. The method of claim 4, wherein the inorganic material is an HSQ-based material (hydrogensilsesquioxane-based material) or an MSQ-based material (methyl silsesquioxane-based material).

6. The method of claim 1, wherein:
the plurality of contact holes are formed in recessed portions of the first, the second, and the third gate electrodes and the first and the second source/drain areas; and
a depth of the recessed portion in the interface area is larger than a depth of the recessed portion in the first transistor area or the second transistor area.

7. The method of claim 1, wherein:
a first transistor is an n-channel metal oxide semiconductor (NMOS) transistor; and
a second transistor is a p-channel metal oxide semiconductor (PMOS) transistor.

8. The method of claim 7, wherein:
the first stress film has tensile stress of about 0.01 to about 5 GPa; and
the second stress film has compressive stress of about −0.01 to about −5 GPa.

9. The method of claim 1, wherein the first stress film and the second stress film are formed of silicon nitride (SiN), silicon oxynitride (SiON), silicon boron nitride (SiBN), silicon carbide (SiC), hydrogenated silicon carbide (SiC:H), hydrogenated silicon oxycarbide (SiCOH), silicon carbon nitride (SiCN), silicon dioxide ($SiO_2$), or a combination thereof.

10. The method of claim 9, wherein the first stress film and the second stress film are about 1 to about 1000 angstroms (Å) in thickness.

11. The method of claim 10, wherein a thickness of the first stress film is substantially the same as a thickness of the second stress film.

12. The method of claim 1, further comprising:
forming an etch stop film on the first stress film;
wherein the removing of the first stress film of the interface area includes removing the etch stop film and the first stress film.

13. The method of claim 12, wherein the second stress film is thicker than the first stress film.

14. The method of claim 1, wherein the first, the second, and the third gate electrodes and the first and the second source/drain areas have upper sides including silicide films.

15. The method of claim 1, wherein the interlayer insulating film is formed of tetra ethyl ortho silicate (TEOS), (ozone) $O_3$-(tetra ethyl ortho silicate) TEOS, silicon dioxide ($SiO_2$), silicon oxynitride (SiON), silicon oxycarbide (SiOC), or a combination thereof.

* * * * *